United States Patent
Chen

(10) Patent No.: US 10,757,826 B2
(45) Date of Patent: Aug. 25, 2020

(54) DISPLAY DEVICE AND FRAME ASSEMBLY

(71) Applicant: QISDA CORPORATION, Taoyuan (TW)

(72) Inventor: Chun-Ting Chen, Taoyuan (TW)

(73) Assignee: Qisda Corporation, Taoyuan (TW)

( * ) Notice: Subject to any disclaimer, the term of this patent is extended or adjusted under 35 U.S.C. 154(b) by 0 days.

(21) Appl. No.: 16/360,026

(22) Filed: Mar. 21, 2019

(65) Prior Publication Data

US 2020/0221592 A1 Jul. 9, 2020

(30) Foreign Application Priority Data

Jan. 4, 2019 (CN) .......................... 2019 1 0006677

(51) Int. Cl.
*H05K 5/02* (2006.01)
*H05K 5/00* (2006.01)

(52) U.S. Cl.
CPC ......... *H05K 5/0217* (2013.01); *H05K 5/0017* (2013.01)

(58) Field of Classification Search
CPC .......................... H05K 5/0217; H05K 5/0017
See application file for complete search history.

(56) References Cited

U.S. PATENT DOCUMENTS

| | | | | |
|---|---|---|---|---|
| 7,916,240 B2* | 3/2011 | Huang | ............. | G02F 1/133308 349/58 |
| 8,477,257 B2* | 7/2013 | Nakano | ............. | G02F 1/133308 349/58 |
| 8,905,617 B2* | 12/2014 | Jeong | ................ | G02F 1/133308 362/632 |
| 9,389,449 B2* | 7/2016 | Bang | ................ | G02F 1/133308 |

FOREIGN PATENT DOCUMENTS

| | | |
|---|---|---|
| CN | 202332108 U | 7/2012 |
| CN | 104950498 A | 9/2015 |
| CN | 105044982 A | 11/2015 |
| KR | 10-2008-0016218 A | 2/2008 |
| TW | 200912442 | 3/2009 |

* cited by examiner

*Primary Examiner* — Rockshana D Chowdhury

(57) ABSTRACT

A display device includes a frame assembly, a display panel and a casing. The frame assembly includes a plate member and a frame body. A periphery of the plate member has a plurality of first connecting portions and a plurality of second connecting portions. A height difference exists between the first connecting portion and the second connecting portion. The first connecting portion has a first hole and the second connecting portion has a second hole. The frame body covers the periphery of the plate member. The frame body has a plurality of third connecting portions and a plurality of fourth connecting portions. The third connecting portion is embedded into the first hole and the fourth connecting portion is embedded into the second hole. The display panel is disposed on a first side of the frame assembly and the casing is disposed on a second side of the frame assembly.

4 Claims, 5 Drawing Sheets

DISPLAY DEVICE AND FRAME ASSEMBLY

BACKGROUND OF THE INVENTION

1. Field of the Invention

The invention relates to a display device and a frame assembly and, more particularly, to a frame assembly beneficial to design a thin display device and a display device equipped with the frame assembly.

2. Description of the Prior Art

To satisfy a user with the requirements of image quality and appearance, there is a tendency towards a narrow frame for designing a display device. To achieve the narrow frame, some prior arts take a front bezel of a panel module to be an appearance and connect a back plate of the panel module to a frame. In general, an edge of the back plate needs to be bent with a specific thickness to cover the frame, such that the back plate is connected with the frame tightly. However, the aforesaid connection between the back plate and the frame will increase the width of the frame, such that it is not beneficial to design a thin display device.

SUMMARY OF THE INVENTION

An objective of the invention is to provide a frame assembly beneficial to design a thin display device and a display device equipped with the frame assembly, so as to solve the aforesaid problems.

According to an embodiment of the invention, a display device comprises a frame assembly, a display panel and a casing. The frame assembly comprises a plate member and a frame body. A periphery of the plate member has a plurality of first connecting portions and a plurality of second connecting portions. A height difference exists between the first connecting portion and the second connecting portion. The first connecting portion has a first hole and the second connecting portion has a second hole. The frame body covers the periphery of the plate member. The frame body has a plurality of third connecting portions and a plurality of fourth connecting portions. The third connecting portion is embedded into the first hole and the fourth connecting portion is embedded into the second hole. The display panel is disposed on a first side of the frame assembly and the casing is disposed on a second side of the frame assembly, wherein the first side is opposite to the second side.

According to another embodiment of the invention, a frame assembly comprises a plate member and a frame body. A periphery of the plate member has a plurality of first connecting portions and a plurality of second connecting portions. A height difference exists between the first connecting portion and the second connecting portion. The first connecting portion has a first hole and the second connecting portion has a second hole. The frame body covers the periphery of the plate member. The frame body has a plurality of third connecting portions and a plurality of fourth connecting portions. The third connecting portion is embedded into the first hole and the fourth connecting portion is embedded into the second hole.

As mentioned in the above, the invention forms the connecting portions with a height difference at the periphery of the plate member and each of the connecting portions has a hole. The frame body may be formed by an injection molding process to cover the periphery of the plate member, such that the connecting portions of the frame body are embedded into the holes of the connecting portions of the plate member. Accordingly, the frame body can be connected with the plate member tightly. Since the edge of the plate member does not need to be bent, the width of the frame assembly can be reduced effectively, such that the frame assembly of the invention is beneficial to design a thin display device.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
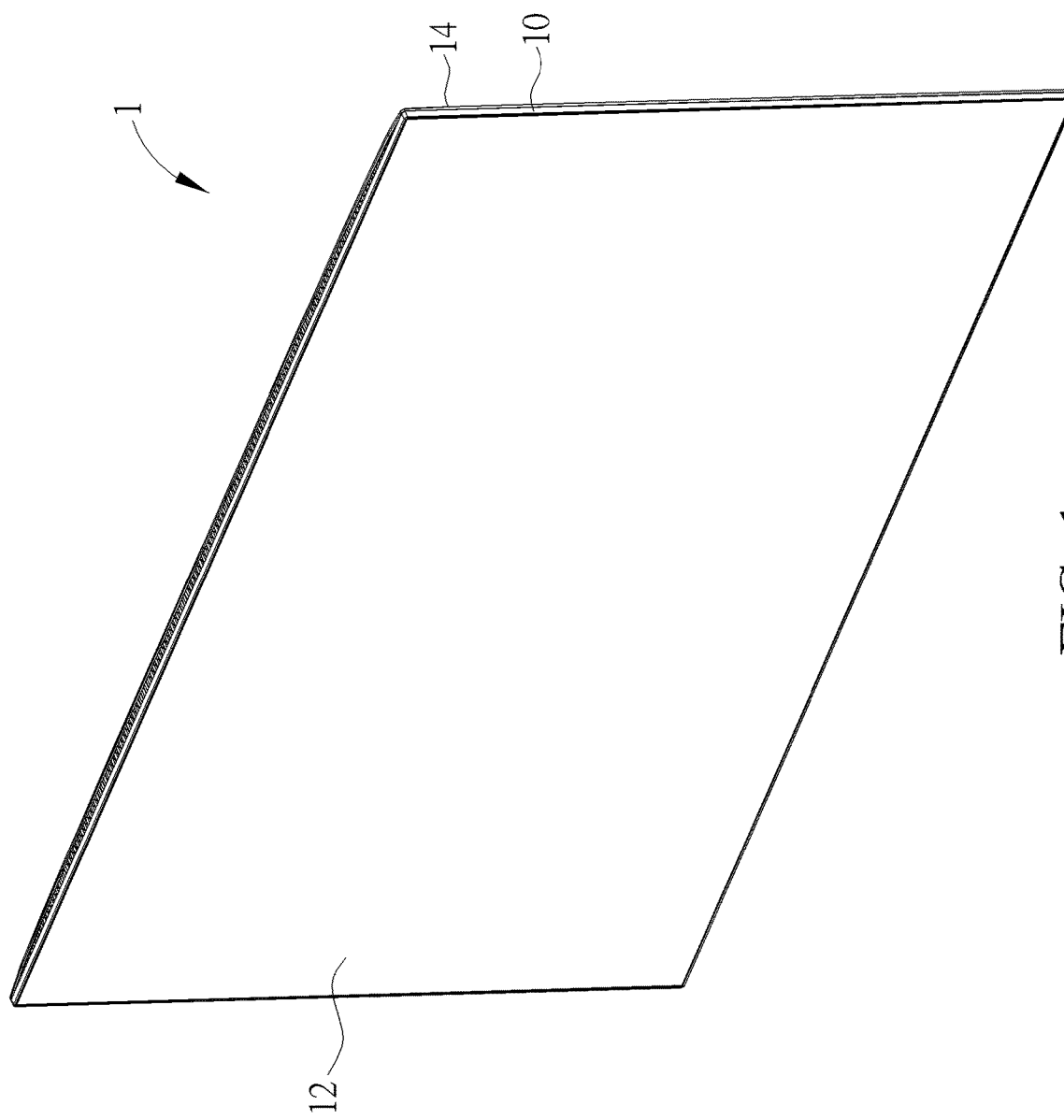
FIG. 1 is a perspective view illustrating a display device according to an embodiment of the invention.
Figure 2:
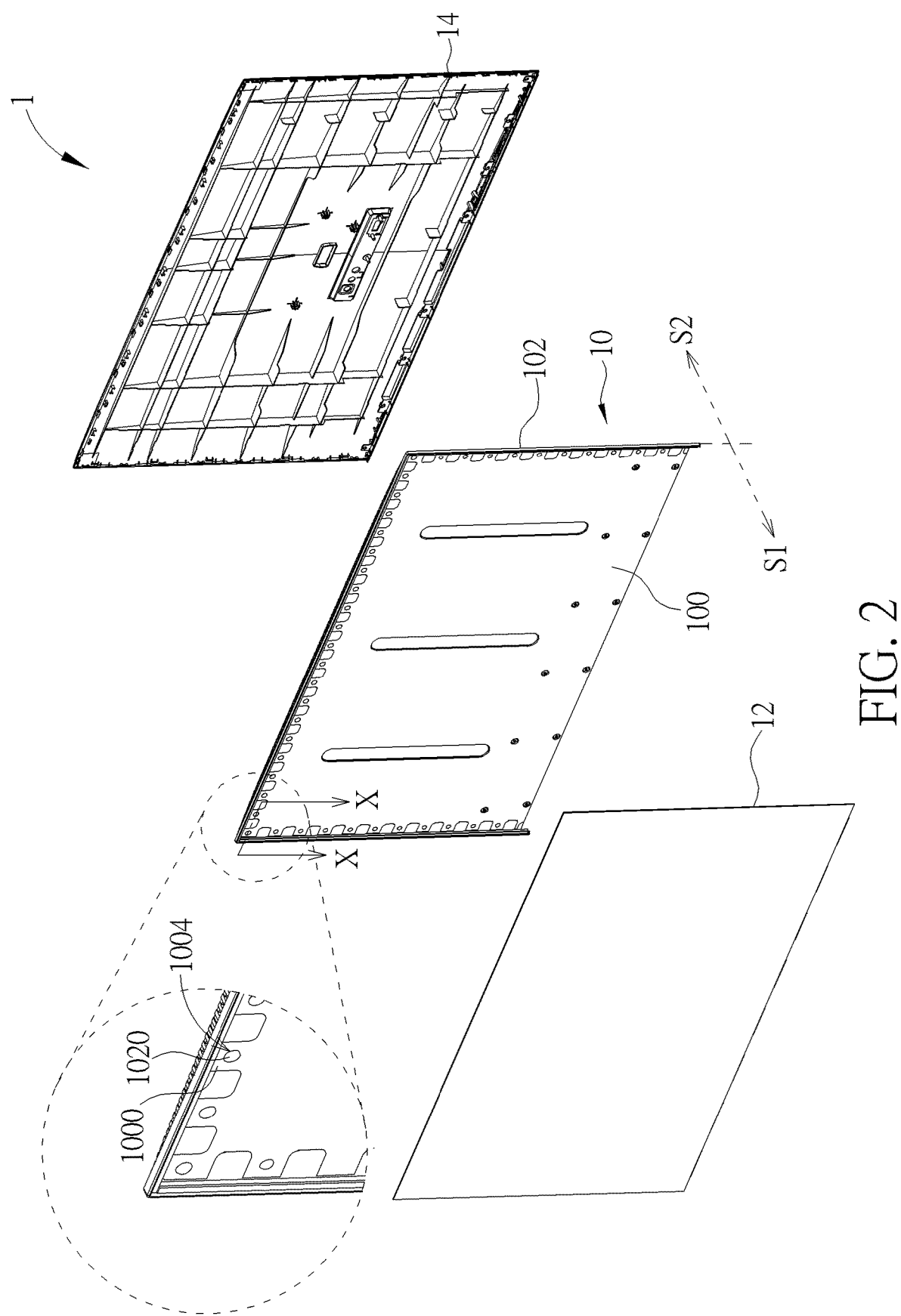
FIG. 2 is an exploded view illustrating the display device shown in FIG. 1.
Figure 3:
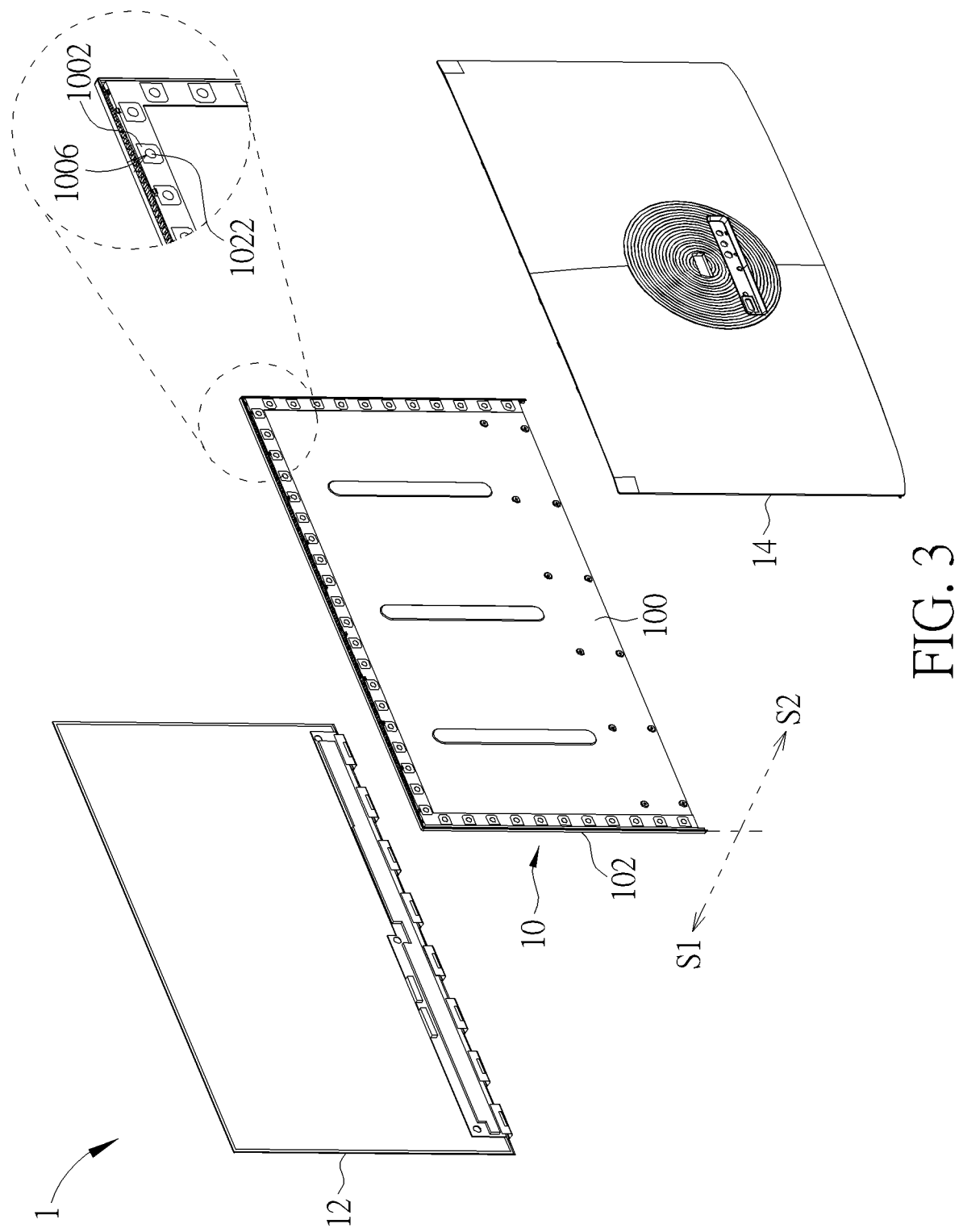
FIG. 3 is an exploded view illustrating the display device shown in FIG. 1 from another viewing angle.
Figure 4:
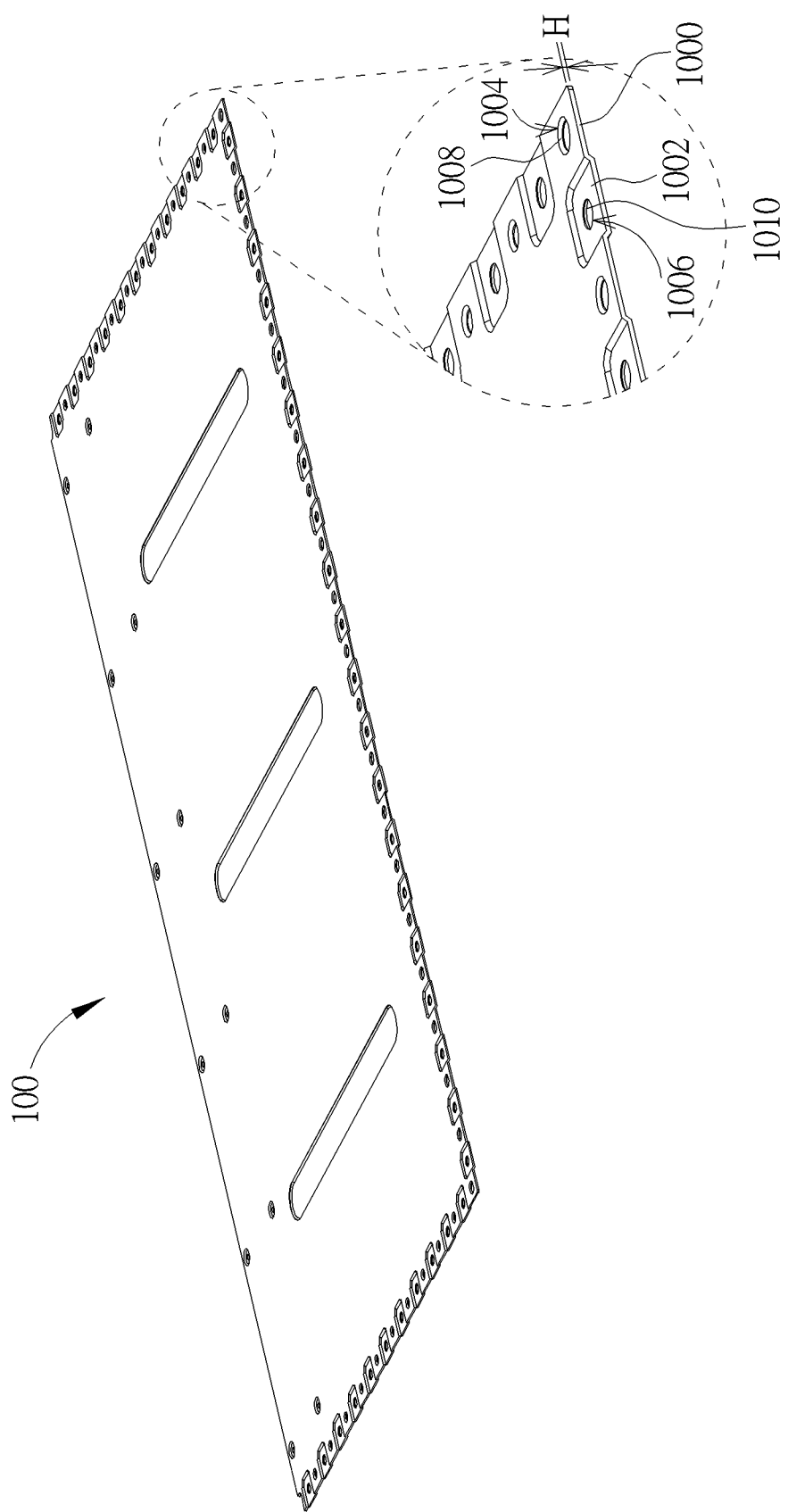
FIG. 4 is a perspective view illustrating the plate member shown in FIG. 2.
Figure 5:
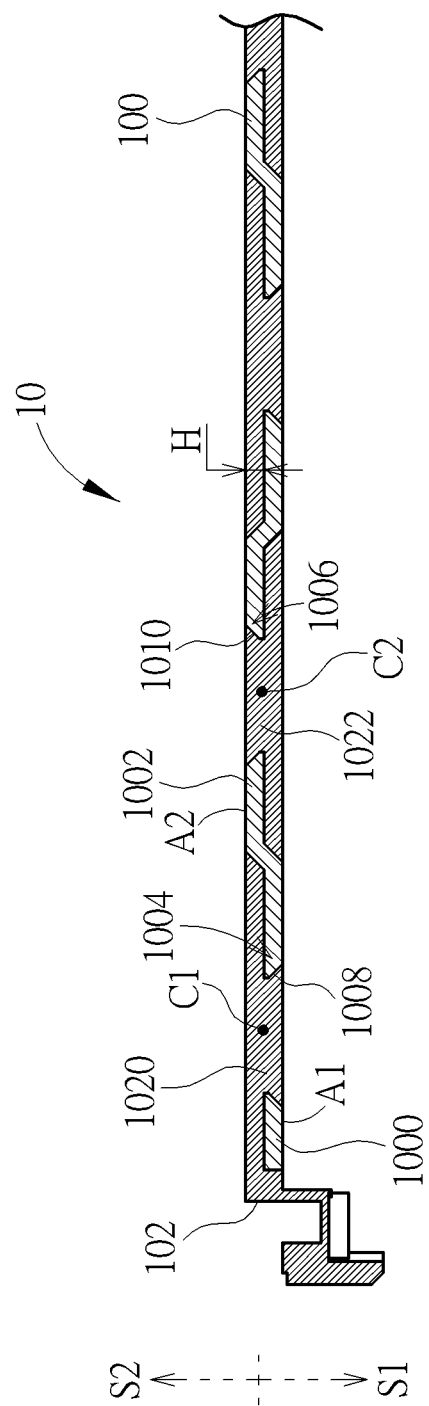
FIG. 5 is a sectional view illustrating the frame assembly along line X-X shown in FIG. 1.

Referring to FIGS. 1 to 5, FIG. 1 is a perspective view illustrating a display device 1 according to an embodiment of the invention, FIG. 2 is an exploded view illustrating the display device 1 shown in FIG. 1, FIG. 3 is an exploded view illustrating the display device 1 shown in FIG. 1 from another viewing angle, FIG. 4 is a perspective view illustrating the plate member 100 shown in FIG. 2, and FIG. 5 is a sectional view illustrating the frame assembly 10 along line X-X shown in FIG. 1.

As shown in FIGS. 1 to 3, the display device 1 comprises a frame assembly 10, a display panel 12 and a casing 14. In this embodiment, the display device 1 may be a liquid crystal display device, a plasma display device, an organic light emitting diode display device, or other display devices, and the display panel 12 may be a liquid crystal display panel, a plasma display panel, an organic light emitting diode display panel, or other display panels. The display panel 12 is disposed on a first side S1 of the frame assembly 10 and the casing 14 is disposed on a second side S2 of the frame assembly 10, wherein the first side S1 is opposite to the second side S2.

The frame assembly 10 comprises a plate member 100 and a frame body 102. In practical applications, the plate member 100 may be, but not limited to, a back plate of the display panel 12. As shown in FIGS. 2 to 5, a periphery of the plate member 100 has a plurality of first connecting portions 1000 and a plurality of second connecting portions 1002. In this embodiment, a height difference H exists between the first connecting portion 1000 and the second connecting portion 1002 (as shown in FIG. 4), such that the first connecting portions 1000 and the second connecting portions 1002 form an uneven structure at the periphery of the plate member 100. Furthermore, the first connecting portion 1000 has a first hole 1004 and the second connecting portion 1002 has a second hole 1006.

The frame body 102 covers the periphery of the plate member 100. As shown in FIGS. 2, 3 and 5, the frame body 102 has a plurality of third connecting portions 1020 and a plurality of fourth connecting portions 1022. In this embodiment, the frame body 102 may be formed by an injection molding process to cover the periphery of the plate member 100, such that the third connecting portion 1020 of the frame body 102 is embedded into the first hole 1004 of the first connecting portion 1000 of the plate member 100, and the fourth connecting portion 1022 of the frame body 102 is embedded into the second hole 1006 of the second connecting portion 1002 of the plate member 100. Accordingly, the frame body 102 can be connected with the plate member 100 tightly.

In this embodiment, the first hole 1004 may have a first chamfer 1008 and the second hole 1006 may have a second chamfer 1010. As shown in FIG. 5, the first chamfer 1008 inclines from a surface A1 of the first connecting portion 1000 towards a center C1 of the first hole 1004 and the second chamfer 1010 inclines from a surface A2 of the second connecting portion 1002 towards a center C2 of the second hole 1006. Thus, when the frame body 102 is formed by the injection molding process to cover the periphery of the plate member 100, the third connecting portion 1020 is embedded into the first hole 1004 to cover the first chamfer 1008 and the fourth connecting portion 1022 is embedded into the second hole 1006 to cover the second chamfer 1010. Accordingly, the connecting strength between the frame body 102 and the plate member 100 can be enhanced, so as to ensure that the frame body 102 and the plate member 100 will not disengage from each other.

Furthermore, after the frame body 102 is formed by the injection molding process to cover the periphery of the plate member 100, the first connecting portion 1000 of the plate member 100 may be flush with the frame body 102 at the first side S1 and the second connecting portion 1002 of the plate member 100 may be flush with the frame body 102 at second side S2. Accordingly, the width of the frame assembly 10 can be reduced effectively.

As mentioned in the above, the invention forms the connecting portions with a height difference at the periphery of the plate member and each of the connecting portions has a hole. The frame body may be formed by an injection molding process to cover the periphery of the plate member, such that the connecting portions of the frame body are embedded into the holes of the connecting portions of the plate member. Accordingly, the frame body can be connected with the plate member tightly. Since the edge of the plate member does not need to be bent, the width of the frame assembly can be reduced effectively, such that the frame assembly of the invention is beneficial to design a thin display device. Furthermore, the hole of the connecting portion of the plate member may have a chamfer, such that the connecting strength between the frame body and the plate member can be enhanced, so as to ensure that the frame body and the plate member will not disengage from each other. Moreover, after the frame body is formed by the injection molding process to cover the periphery of the plate member, the connecting portions of the plate member may be flush with the frame body, so as to reduce the width of the frame assembly effectively.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A display device comprising:
a frame assembly comprising a plate member and a frame body, a periphery of the plate member having a plurality of first connecting portions and a plurality of second connecting portions, a height difference existing between the first connecting portion and the second connecting portion, the first connecting portion having a first hole, the second connecting portion having a second hole, the frame body covering the periphery of the plate member, the frame body having a plurality of third connecting portions and a plurality of fourth connecting portions, the third connecting portion being embedded into the first hole, the fourth connecting portion being embedded into the second hole, the first hole having a first chamfer, the first chamfer inclining from a surface of the first connecting portion towards a center of the first hole, the third connecting portion covering the first chamfer, the first connecting portion and the second connecting portion being flush with the frame body;
a display panel disposed adjacent to a first surface of the plate member; and
a casing disposed adjacent to a second surface of the plate member, the first surface and the second surface being opposite surfaces of the plate member.

2. The display device of claim 1, wherein the second hole has a second chamfer, the second chamfer inclines from a surface of the second connecting portion towards a center of the second hole, and the fourth connecting portion covers the second chamfer.

3. A frame assembly comprising:
a plate member, a periphery of the plate member having a plurality of first connecting portions and a plurality of second connecting portions, a height difference existing between the first connecting portion and the second connecting portion, the first connecting portion having a first hole, the second connecting portion having a second hole, the first hole having a first chamfer, the first chamfer inclining from a surface of the first connecting portion towards a center of the first hole; and
a frame body covering the periphery of the plate member, the frame body having a plurality of third connecting portions and a plurality of fourth connecting portions, the third connecting portion being embedded into the first hole, the fourth connecting portion being embedded into the second hole, the third connecting portion covering the first chamfer, the first connecting portion and the second connecting portion being flush with the frame body.

4. The frame assembly of claim 3, wherein the second hole has a second chamfer, the second chamfer inclines from a surface of the second connecting portion towards a center of the second hole, and the fourth connecting portion covers the second chamfer.

* * * * *